United States Patent
Sunaga et al.

(10) Patent No.: US 7,123,110 B2
(45) Date of Patent: Oct. 17, 2006

(54) LOW POWER SELF REFRESH TIMER OSCILLATOR

(75) Inventors: Toshio Sunaga, Ohtsu (JP); Takeo Yasuda, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,127

(22) Filed: Oct. 25, 2004

(65) Prior Publication Data

US 2005/0128009 A1    Jun. 16, 2005

(30) Foreign Application Priority Data

Oct. 24, 2003    (JP) .............................. 2003-365224

(51) Int. Cl.
H03K 3/02    (2006.01)
H03K 7/00    (2006.01)

(52) U.S. Cl. ..................... 331/111; 331/143; 331/153

(58) Field of Classification Search ................. 331/111, 331/143, 153
See application file for complete search history.

(56) References Cited

U.S. PATENT DOCUMENTS 3,831,113 A * 8/1974 Ahmed ..................... 331/111
5,412,350 A * 5/1995 Kim .......................... 331/111
5,889,441 A * 3/1999 Inn ............................ 331/143

FOREIGN PATENT DOCUMENTS

| JP | A-H08-279733 | 7/1996 |
| JP | A-H08-171795 | 10/1996 |
| JP | A-H10-289573 | 10/1998 |
| JP | A-2000-163955 | 6/2000 |

* cited by examiner

*Primary Examiner*—Joseph Chang
(74) *Attorney, Agent, or Firm*—Michael J. LeStrange (57) ABSTRACT

A low power oscillator circuit for a self-refresh timer in a memory array is disclosed. When a voltage (V1) of a comparison node (N1) exceeds a first reference voltage (Vref1), a differential amplifier (101) in an oscillator (1) causes a pulse generator (110) to output a pulse. A charge/discharge circuit (105) discharges the comparison node (N1) in response to pulse. In this event, a control circuit (4) disables a first control signal (CT1) to halt operation of the differential amplifier (101). When the voltage (V1) exceeds a second reference voltage (Vref2) equivalent to the sum of threshold voltages of a discharge circuit (43) in consequence of gradually charging the comparison node (N1) by the charge/discharge circuit (105) after it was discharged, the control circuit (4) activates the first control signal (CT1) to operate the differential amplifier (101).

18 Claims, 5 Drawing Sheets

PRIOR ART

Fig.5

LOW POWER SELF REFRESH TIMER OSCILLATOR

FIELD OF THE INVENTION

The present invention relates to an oscillator and, more specifically, relates to an oscillator for use in a semiconductor memory device.

BACKGROUND OF THE INVENTION

A dynamic random access memory (DRAM) is capable of storing information based on the amount of charge held in a storage capacitor for each memory cell in the array. Over time, the charge in the storage capacitor dissipates and must be restored to maintain the integrity of the data held in memory. Accordingly, a number of prior art schemes have been proposed to "refresh" the data held in a memory. One approach for implementing memory refresh incorporates an automatic process controlled by a timer to define the interval required for refresh. As the density of memory arrays has expanded, the charging and discharging of the storage capacitors in each cell of the memory begins to represent a significant source of power dissipation. Accordingly, if power can be reduced on a unit cell basis, then a significant power savings can be realized for an entire array.

SUMMARY OF THE INVENTION

Figure 4:
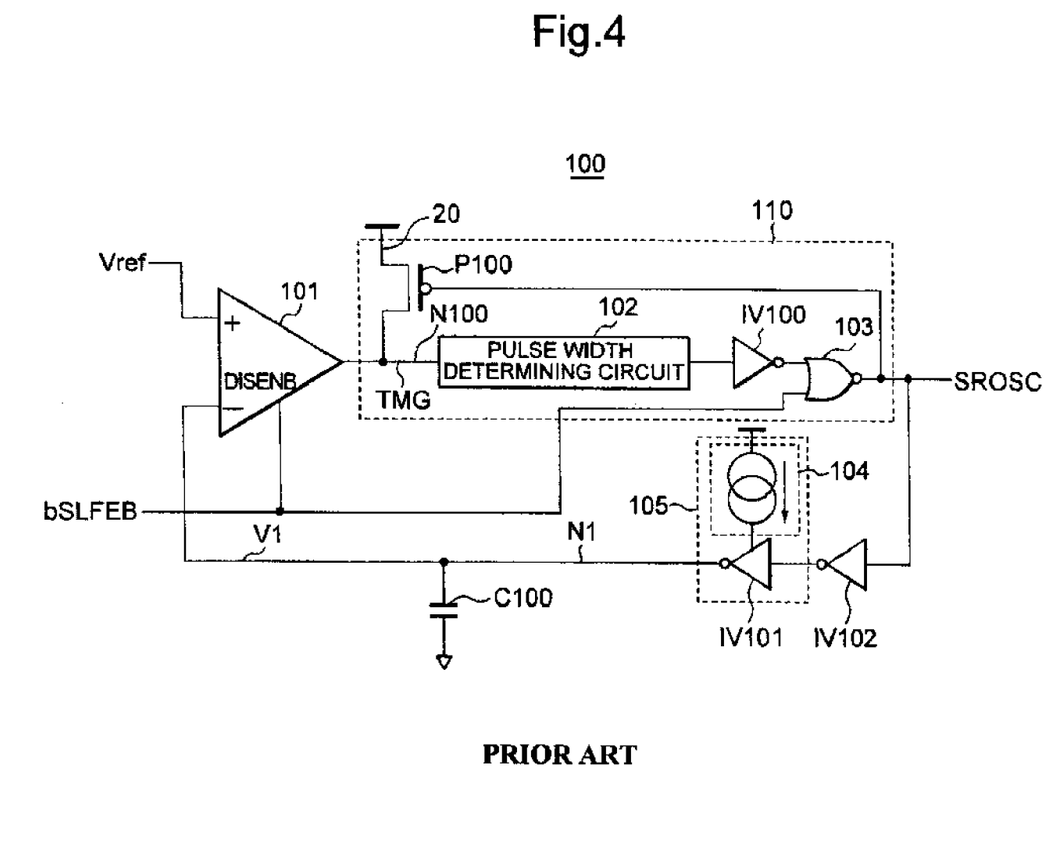
FIG. 4 is a functional block diagram showing a structure of a conventional oscillator.

It is an object of the present invention to provide an oscillator for a refresh timer of a memory array that reduces overall power dissipation in the integrated circuit memory array. A DRAM (Dynamic Random Access Memory) includes an oscillator that functions as a timer upon carrying out a refresh operation. Referring to FIG. 4, oscillator 100 includes a differential amplifier 101 for comparing a voltage V1 of a comparison node N1 with a reference voltage Vref to output a timing signal TMG to node N100, pulse generator 110 that outputs a logic low pulse in response to timing signal TMG being asserted low, capacitor C100 that is connected to comparison node N1, and a charge/discharge circuit 105 for charging/discharging the capacitor C100. The charge/discharge circuit 105 includes constant current source 104, which exhibits minimal temperature dependence, and an inverter IV101. Charge/discharge circuit 105 charges capacitor C100 when output signal SROSC (self-refresh oscillator) from pulse generator 110 is asserted to a logic one. As a result, the voltage V1 of comparison node N1 increases. Conversely, when output signal SROSC of pulse generator 110 transitions to a logic zero, charge/discharge circuit 105 discharges capacitor C100.

Figure 5:
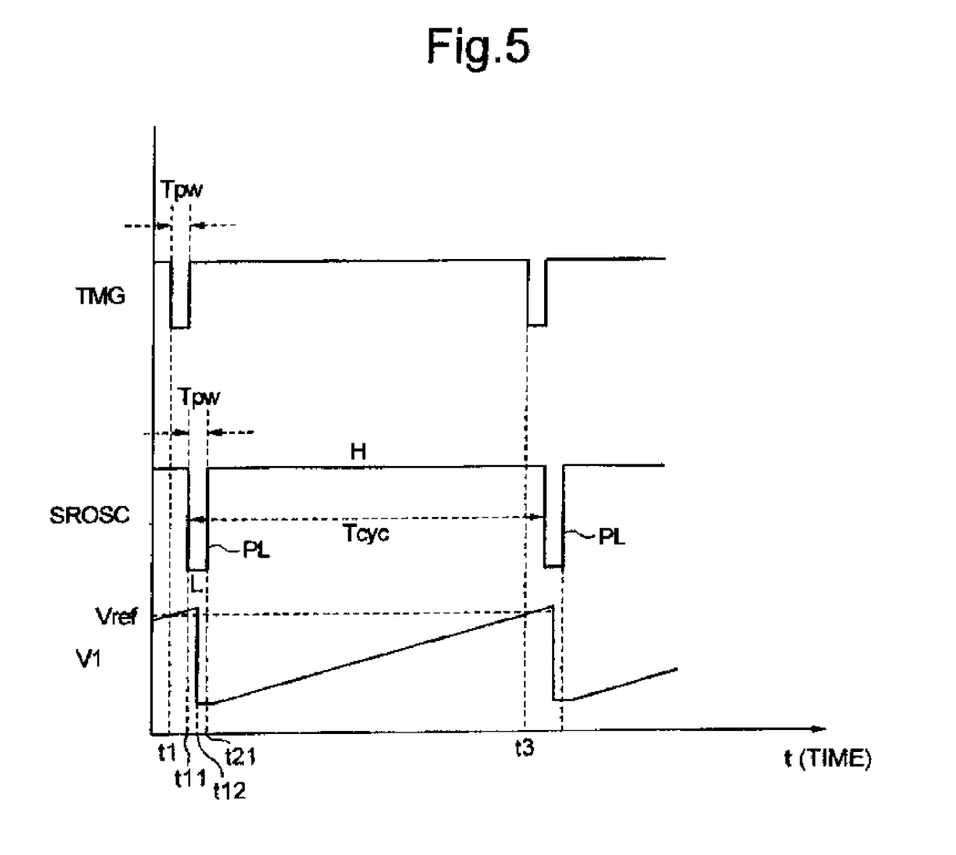
FIG. 5 is a waveform diagram showing operation of the oscillator shown in FIG. 4.

Referring to FIGS. 4 and 5, charge/discharge circuit 105 gradually raises voltage V1 of comparison node N1 before time t1. Then, at time t1, voltage V1 exceeds reference voltage Vref. In this event, timing signal TMG output from differential amplifier 101 transitions to a logic zero, which is propagated to output SROSC of pulse generator 110. In response to pulse PL, an N-channel MOS transistor (not illustrated) in inverter IV101 of the charge/discharge circuit 105 is turned on, providing a discharge path for capacitor C100 and resulting in voltage V1 decreasing at time t12.

At time t11, after a lapse of a predetermined pulse width Tpw from time t1, pulse generator 110 asserts signal SROSC to a logic zero. Pulse width Tpw is determined by pulse width determining circuit 102. When signal SROSC transitions low, P-channel MOS transistor P100 is turned on so that timing signal TMG at node N100 is clamped high.

Subsequent to time t21 after a lapse of pulse width Tpw from time t11, charge/discharge circuit 105 receives the inverted signal of output signal SROSC corresponding to a logic one. In this event, a P-channel MOS transistor (not illustrated) in inverter IV101 is turned on so that the charge is fed to capacitor C100 from constant current source 104. As a result, voltage V1 gradually rises after time t21.

When voltage V1 exceeds reference voltage Vref at time t3 in consequence of charge/discharge circuit 105 charging capacitor C100, differential amplifier 101 again sets the timing signal TMG to a logic zero so that pulse generator 110 outputs logic zero pulse PL.

While oscillator 100 outputs logic zero pulse PL every Tcyc, differential amplifier 101 in oscillator 100 compares voltage V1 of comparison node N1 with reference voltage Vref. Therefore, an operating current must flow constantly in the differential amplifier 101 and a charging current is also constantly supplied to the capacitor C100. However, the charging current is suppressed to ensure a long charging time and is therefore much smaller in magnitude than the operating current of differential amplifier 101. Indeed, most of the operating current of oscillator 100 is drawn by differential amplifier 101. Oscillator 100 is used in a self-refresh operation of a DRAM and is therefore required to operate even in a standby mode of the DRAM. Therefore, the operating current of differential amplifier 101 significantly impacts the standby current, which, in turn, affects the average operating current and total power dissipated by the array.

An oscillator according to the present invention includes a comparator circuit, pulse generator, charge/discharge circuit, and control circuit. The comparator asserts a timing signal after determining when a voltage at a comparison node exceeds a first reference voltage. The pulse generator outputs a pulse in response to receipt of the asserted timing signal. The charge/discharge circuit discharges the comparison node when the pulse is received, and charges the comparison node when the pulse is not received. The control circuit halts operation of the comparator when the voltage of the comparison node does not exceed a second reference voltage lower than the first reference voltage.

The oscillator according to the present invention halts operation of the comparator during the period between the discharge and charge of the comparison node to ensure the comparison node voltage exceeds the second reference voltage. This is achievable since the timing signal can be activated timely even if the comparator is operated after the voltage of the comparison node rises to the vicinity of the first reference voltage. Therefore, the current draw of the comparator can be reduced according to the present invention, thereby reducing the power consumed by the oscillator.

Preferably, the control circuit includes a control node, a first charge circuit, and a first discharge circuit. The control node outputs a first control signal used for operating the comparator. The first charge circuit charges the control node when the voltage of the comparison node is lower than the second reference voltage. The first discharge circuit discharges the control node during a period in which the voltage of the comparison node exceeds the second reference voltage.

In this case, the control circuit charges or discharges the control node using the first charge circuit or the first discharge circuit to enable or disable the first control signal. The first discharge circuit does not discharge the control node while the first charge circuit charges the control node, and the first charge circuit does not charge the control node while the first discharge circuit discharges the control node.

Therefore, generation of a short-circuit current can be suppressed within the control circuit, thereby reducing the overall power dissipation of the oscillator.

Preferably, the first charge circuit includes a pulse delay circuit and a first transistor. The pulse delay circuit outputs a delayed pulse and the first transistor is turned on in response to the delayed pulse.

When the pulse generator output is enabled, the comparison node is discharged. In this event, since the voltage of the comparison node becomes lower than the second reference voltage, the first discharge circuit in the control circuit stops the discharge. That is, the first discharge circuit operates from a time when the voltage of the comparison node exceeds the second reference voltage until the pulse generator output is received. Conversely, the first charge circuit receives the delayed pulse after a lapse of a predetermined time from when the pulse generator output is enabled. That is, the first charge circuit is active for one pulse width after the pulse generator outputs a pulse. As a result, by using the pulse generator output as a trigger for the first charge circuit, the active period of the first charge circuit can be temporally displaced from the active period of the first discharge circuit. Therefore, generation of the short-circuit current can be suppressed in the control circuit thereby reducing the power dissipated in the oscillator.

Preferably, the first discharge circuit includes a second transistor and a third transistor. The second transistor has a drain connected to the control node and a gate connected to the comparison node. The third transistor is connected in series to the second transistor and diode-connected thereto. Using the diode-connected third transistor, an adjustment can be made to ensure the comparator remains off for as long as possible.

Preferably, the oscillator further includes a waveform shaping circuit. The waveform shaping circuit outputs a second control signal with a steeper transient that is derived from the first control signal. The waveform shaping circuit includes a reshaping node, a second charge circuit, and a second discharge circuit. The waveform shaping circuit outputs the second control signal. The second charge circuit charges the reshaping node during a period in which the first control signal is active. The second discharge circuit discharges the reshaping node during a period in which the second charge circuit does not charge the reshaping node.

Because of the gradual charging of the comparison node and an effect of the diode-connected third transistors, the slope of the waveform of the first control signal output from the control circuit is shallow, and further, the first control signal does not drop to a ground potential. Due to this effect of the first control signal, short-circuit current only flows in the elements downstream to the control circuit. In this regard, the short-circuit current can be suppressed by outputting the second control signal obtained in the waveform shaping circuit by making the slope of the waveform of the first control signal steeper when it shifts to an active state.

The waveform shaping circuit charges the shaping node using the second charge circuit in response to the first control signal. Since the second discharge circuit in the waveform shaping circuit has already halted its operation, the slope of a waveform, upon shifting, of the second control signal can be made steeper. Further, by halting the operation of the second discharge circuit during the operation of the second charge circuit, the short-circuit current in the waveform shaping circuit can also be suppressed.

Preferably, the oscillator further includes a switch and a voltage clamp. The switch is connected between the comparator and the pulse generator. The switch is turned off when the first control signal is disabled and turned on when the first control signal is enabled. The voltage clamp disables the timing signal when the first control signal is disabled, but allows the timing signal to propagate when the first control signal is enabled.

When the first control signal is disabled, the comparator is off. In this event, since the timing signal is in a high impedance state, there is a possibility that noise may added to the timing signal. To reduce the incidence of spurious noise signals corrupting the timing signal, the switch is turned off when the first control signal is disabled. Turning off the switch prevents transmission of a noisy timing signal to the pulse generator. Further, when the first control signal is disabled, the voltage of the timing signal is fixed by the voltage clamp. Therefore, it is possible to prevent transmission of noise to the pulse generator and prevent malfunction of the oscillator.

Preferably, the switch is turned on after the activation of the first control signal, and the voltage clamp is disabled thereafter.

When operation of the comparator is initialized, there is a possibility that noise may be superimposed on the timing signal due to metastability in the comparator logic. In the present invention, the switch remains off from the startup of the operation of the comparator. Consequently, noise occurring in the initial operation stage of the comparator is not transmitted to the pulse generator. Further, the voltage clamp continues to operate until after the switch is turned on. If the operation of the voltage clamp is interrupted simultaneously with the switch turning on, it is possible that the timing signal may become unstable due to the effect of coupling capacitance in the switch. Therefore, by turning on the switch prior to disabling the voltage clamp, it is possible to prevent the timing signal from becoming unstable so that malfunction of the oscillator can be prevented.

Preferably, the oscillator further includes a latch connected to an output node of the pulse generator. The latch captures an output signal of the pulse generator while the first control signal is disabled.

In this case, even if noise occurs in the pulse generator while the comparator operation is halted, the output signal of the pulse generator is held by the latch so that the influence of noise can be removed, further reducing the risk of oscillator malfunction.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DETAILED DESCRIPTION OF THE PREFERRED EMBODIMENTS

Hereinbelow, a preferred embodiment of the present invention will be described in detail with reference to the drawings. The same or corresponding portions are assigned the same reference symbols in the figures to thereby avoid repetition of description thereof.

Figure 1:
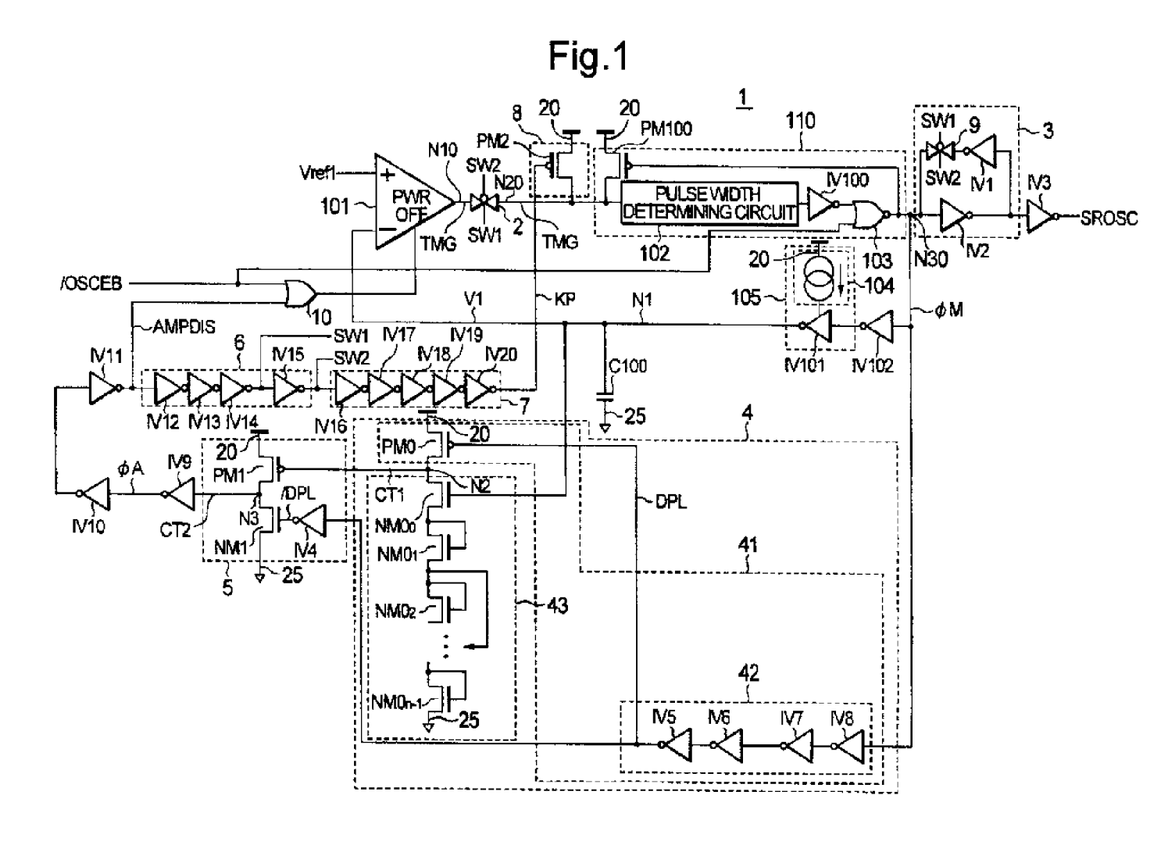
FIG. 1 is a functional block diagram showing a structure of an oscillator according to a preferred embodiment of the present invention.

Referring to FIG. 1, an oscillator 1 according to the preferred embodiment of the present invention includes differential amplifier 101, pulse generator 110, charge/discharge circuit 105, control circuit 4, and waveform shaping circuit 5.

Differential amplifier 101 compares voltage V1 of comparison node N1 with reference voltage Vref1, and outputs timing signal TMG, which is asserted to a logic zero at node N10 when voltage V1 exceeds reference voltage Vref1.

Pulse generator 110 receives timing signal TMG and outputs an intermediate signal ϕM to node N30. When timing signal TMG becomes low, pulse generator 110 generates a logic zero pulse PL at intermediate signal ϕM. Pulse generator 110 includes pulse width determining circuit 102, inverter IV100, NOR gate 103, and P-channel MOS transistor PM100. Pulse width determining circuit 102, inverter IV100, and NOR gate 103 are connected together in series. NOR gate 103 receives an output signal from inverter IV100 and oscillator enable signal /OSCEB and outputs the result. NOR gate 103 is designed to disable operation of oscillator 1. While oscillator 1 is in operation, the oscillator enable signal /OSCEB is held low, and therefore, NOR gate 103 operates as an inverter. The drain of P-channel MOS transistor PM100 is connected to an input terminal of pulse width determining circuit 102, and the gate thereof is connected to node N30. The intermediate signal ϕM is fed back to the gate of transistor PM100, which determines a pulse width of pulse PL.

Charge/discharge circuit 105 charges and discharges comparison node N1. Charge/discharge circuit 105 is connected between inverter IV102 and comparison node N1, and includes constant current source 104 and inverter IV101 supplied by a source current therefrom. Constant current source 104 is connected between VCC node 20, where an internal supply voltage VCC is applied, and a current supply node of the inverter IV101. When the intermediate signal ϕM output by pulse generator 110 is at a logic high level (i.e. when pulse generator 110 outputs no pulse PL), an output signal of the inverter IV102 stays low. In this event, a P-channel MOS transistor (not illustrated) of the inverter IV101 in charge/discharge circuit 105 is turned on so that the charge is fed to comparison node N1 from constant current source 104. Capacitor C100, connected to comparison node N1, is charged so that voltage V1 of comparison node N1 rises. When pulse generator 110 outputs pulse PL at logic zero, an N-channel MOS transistor (not illustrated) of the inverter IV101 in the charge/discharge circuit 105 is turned on so that capacitor C100 connected to comparison node N1 is discharged. No constant current source exists between inverter IV101 and GND node 25 where a ground voltage GND is applied. Therefore, the charge/discharge circuit 105 does not restrict a discharge current flowing to the GND node 25. As a result, voltage V1 of comparison node N1 drops instantly.

Control circuit 4 outputs a control signal CT1 for starting or stopping operation of differential amplifier 101. The control circuit 4 includes charge circuit 41 and discharge circuit 43.

Charge circuit 41 includes pulse delay circuit 42 and P-channel MOS transistor PM0. Pulse delay circuit 42 includes several inverters IV5 to IV8. Pulse delay circuit 42 outputs delayed pulse DPL in response to pulse generator output pulse PL. Transistor PM0 is connected between VCC node 20 and control node N2. Transistor PM0 is turned on in response to receipt of delayed pulse DPL to charge control node N2, thereby driving control signal CT1 high, which represents a disabled state.

Discharge circuit 43 includes N-channel MOS transistors $NM0_0$ to $NM0_{n-1}$ connected in series between control node N2 and GND node 25. The gate of transistor $NM0_0$ is connected to comparison node N1. Transistors $NM0_1$ to $NM0_{n-1}$ are diode-connected, respectively. Therefore, when a gate voltage of transistor $NM0_0$, i.e. voltage V1 of comparison node N1, becomes higher than the sum of threshold values Vthn of transistors $NM0_0$ to $NM0_{n-1}$ (n×Vthn), transistors $NM0_0$ to $NM0_{n-1}$ are turned on. When transistors $NM0_0$ to $NM0_{n-1}$ are turned on, control node N2 is discharged so that control signal CT1 transitions low, which is an active state. Hereinafter, the sum of threshold values Vthn of transistors $NM0_0$ to $NM0_{n-1}$ (n×Vthn) will be referred to as reference voltage Vref2. Discharge circuit 43 is designed so that reference voltage Vref2 stays lower than reference voltage Vref1.

As described above, pulse delay circuit 42 output DPL is coupled to the gate of transistor PM0 in charge circuit 41 to differentiate a period in which transistor PM0 is on, from a period in which discharge circuit 43 is on. This makes it possible to suppress short-circuit current in control circuit 4.

Waveform shaping circuit 5 shapes a waveform of control signal CT1 output from control circuit 4. Control signal CT1 exhibits a shallow slope when transitioning from high to low. This is because voltage V1 of comparison node N1 connected to the gate of transistor $NM0_0$ is charged gradually. In addition, since discharge circuit 43 includes diode-connected transistors $NM0_1$ to $NM0_{n-1}$, the amount of the charge to be dissipated is reduced as the voltage of control node N2 approaches the total sum of threshold voltage of transistors from $NM_1$ to $NM_{n-1}$ ((n−1)×Vthn). When the slope of the waveform is shallow, the short-circuit current occurs in the circuit elements connected to control node N2. To prevent short-circuit currents, it is desirable to make the slope of the waveform steep. In this regard, waveform shaping circuit 5 outputs control signal CT2 at shaping node N3. Control signal CT2 is obtained by increasing the slope of the waveform of control signal CT1.

Figure 2:
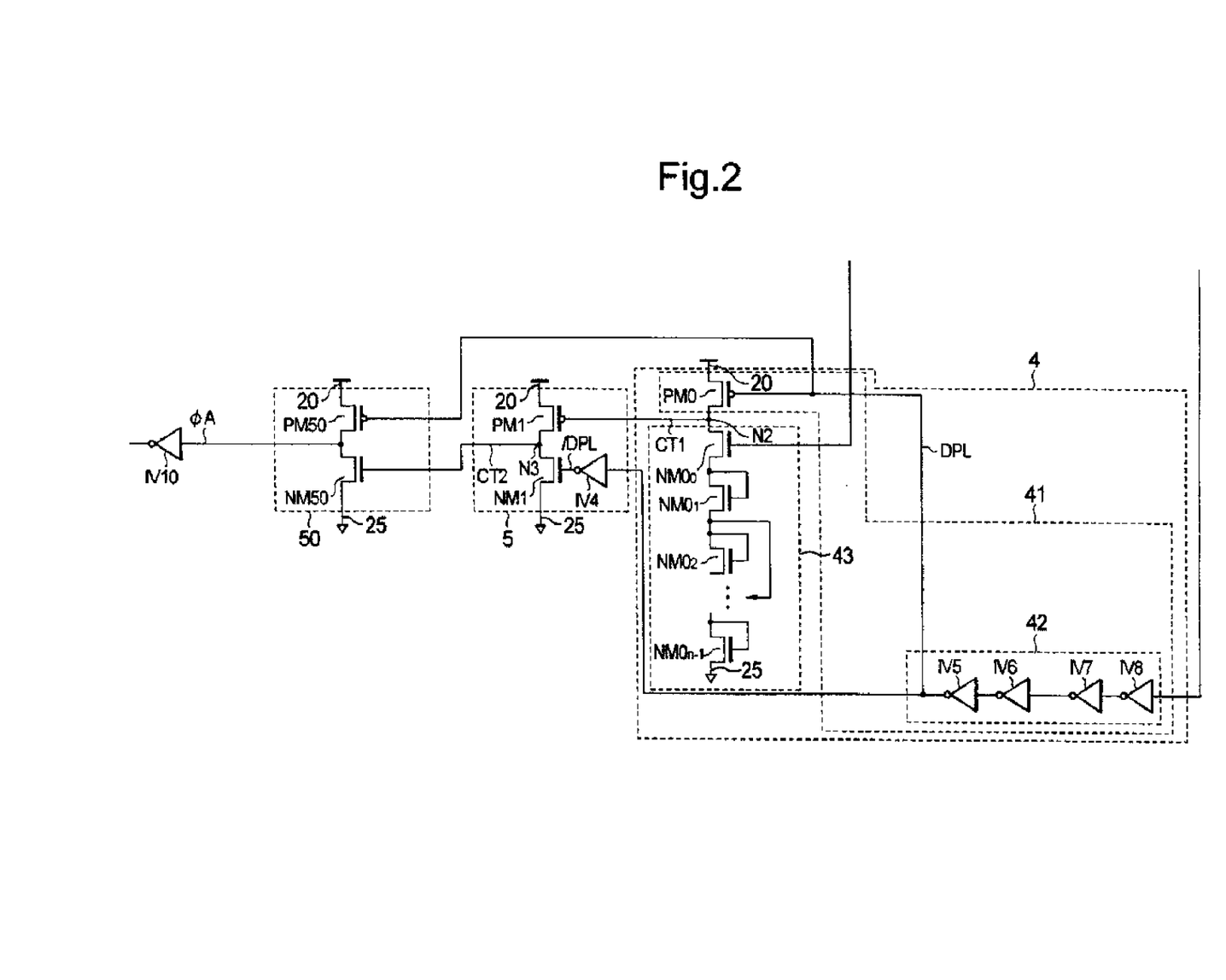
FIG. 2 is a functional block diagram showing a structure of an oscillator including several waveform shaping circuits one of which is shown in FIG. 1, according to a modification of the structure shown in FIG. 1.

Waveform shaping circuit 5 includes P-channel MOS transistor PM1, N-channel MOS transistor NM1, and inverter IV4. Transistor PM1 is connected between VCC node 20 and shaping node N3. Transistor PM1 is turned on in response to receipt of control signal CT1 to charge shaping node N3. Transistor NM1 is connected between shaping node N3 and GND node 25. Transistor NM1 is turned on by inverted delayed pulse /DPL. Inverter IV4 outputs delayed pulse /DPL in response to the output from pulse delay circuit 42 in control circuit 4. Because transistor PM1 and transistor NM1 are not simultaneously active, waveform shaping circuit 5 can also suppress short-circuit currents. Incidentally, although one waveform shaping circuit 5 is shown in FIG. 1, several waveform shaping circuits may be connected after control circuit 4 to further increase the slope of the waveform. For example, as shown in FIG. 2, waveform shaping circuit 50 may be connected after waveform shaping circuit 5 in place of inverter IV9 shown in FIG. 1. Waveform shaping circuit 50 includes P-channel MOS transistor PM50 and N-channel MOS transistor NM50 connected in series to each other between VCC node 20 and GND node 25. Pulse DPL is input to transistor PM50, while control signal CT2 drives the gate of transistor NM50.

If waveform shaping circuits 5 and waveform shaping circuits 50 are alternately connected, the slope of the waveform can be further increased. If the last circuit (i.e. the circuit closest to an inverter IV10) of the alternately connected waveform shaping circuits is the waveform shaping circuit 5, the inverter IV9 is interposed between the inverter IV10 and the last waveform shaping circuit 5. The placement of inverter IV9 prevents the polarity of a waveform of signal φA driving inverter IV10 from inverting depending on the number of connections of the alternately connected waveform shaping circuits.

Control signal CT2 generated by waveform shaping circuit 5 is input to OR gate 10 after propagating through inverters IV9 to IV11. Logic gate 10 receives oscillator enable signal /OSCEB and output signal AMPDIS of inverter IV11 and evaluates a result of the logical OR operation. Oscillator enable signal /OSCEB stays low when oscillator 1 is in operation. Therefore, while oscillator 1 is in operation, differential amplifier 101 is turned on or off depending on a level of signal AMPDIS output by inverter IV11.

Oscillator 1 further includes a switch circuit 2, a voltage fixing circuit 8, a latch circuit 3, and delay circuits 6 and 7. These circuits are provided for holding an output signal SROSC of oscillator 1 when differential amplifier 101 is off, and for preventing malfunction of the oscillator 1 caused by noise that may occur when the differential amplifier 101 is turned on.

Switch circuit 2 is, for example, a CMOS transfer gate and is turned on in response to receipt of switch signal SW1 at a logic one level and switch signal SW2 at a logic zero level.

Switch signals SW1 and SW2 are generated by delay circuit 6, which includes inverters IV12 to IV15. Inverters IV12 to IV15 are connected in series. Delay circuit 6 receives signal AMPDIS from inverter IV11 at the input of inverter IV12, and outputs switch signal SW1 from inverter IV14 output. Further, delay circuit 6 outputs switch signal SW2 obtained by inverting switch signal SW1 through inverter IV15.

When differential amplifier 101 is off, switch circuit 2 is also off. When differential amplifier 101 is turned on, switch circuit 2 is turned on after a lapse of a predetermined time ΔT1, and remaining off in the initial startup stage of differential amplifier 101. As a result, even if noise occurs in the initial startup stage of differential amplifier 101, the noise can be cut off by switch circuit 2 and therefore is not transmitted to the subsequent pulse generator 110. The predetermined time ΔT1 is determined by delay circuit 6.

Voltage clamp 8 includes P-channel MOS transistor PM2. Transistor PM2 is connected between VCC node 20 and an input terminal of pulse generator 110. Transistor PM2 is turned on in response to receipt of clamping signal KP.

Clamping signal KP is output by delay circuit 7, which includes inverters IV16 to IV20 connected in series. Responsive to receipt of switch signal SW2, delay circuit 7 outputs clamping signal KP by delaying switch signal SW2 by a predetermined time ΔT2 and inverting it.

When differential amplifier 101 is turned off, transistor PM2 is turned on to clamp timing signal TMG at node N20 high (inactive state). Conversely, transistor PM2 is turned off after differential amplifier 101 is initialized and further after a lapse of predetermined time ΔT2 from the turning-on of switch circuit 2. Therefore, even after differential amplifier 101 is initialized and switch circuit 2 is turned on, noise, if it is generated within ΔT2 time period after circuit 2 is turned on, is not transmitted to pulse generator 110. This is because voltage clamp 8 fixes timing signal TMG at node N20 to a logic one.

Latch circuit 3 includes inverters IV1 and IV2 and switch circuit 9. Switch circuit 9 is formed by a transfer gate and turned on when switch signal SW1 is low and switch signal SW2 is high. Accordingly, switch circuit 9 is turned on when differential amplifier 101 is turned off. In this regard, cross coupled inverters IV1 and IV2, which form a latch circuit, capture output signal SROSC of pulse generator 110. While differential amplifier 101 is off, output signal SROSC of oscillator 1 is fixed so that malfunction due to noise can be prevented.

Description will be made of the operation of oscillator 1 having the structure shown in FIG. 1. Oscillator 1 enables power saving by operating differential amplifier 101 only during a required period.

Figure 3:
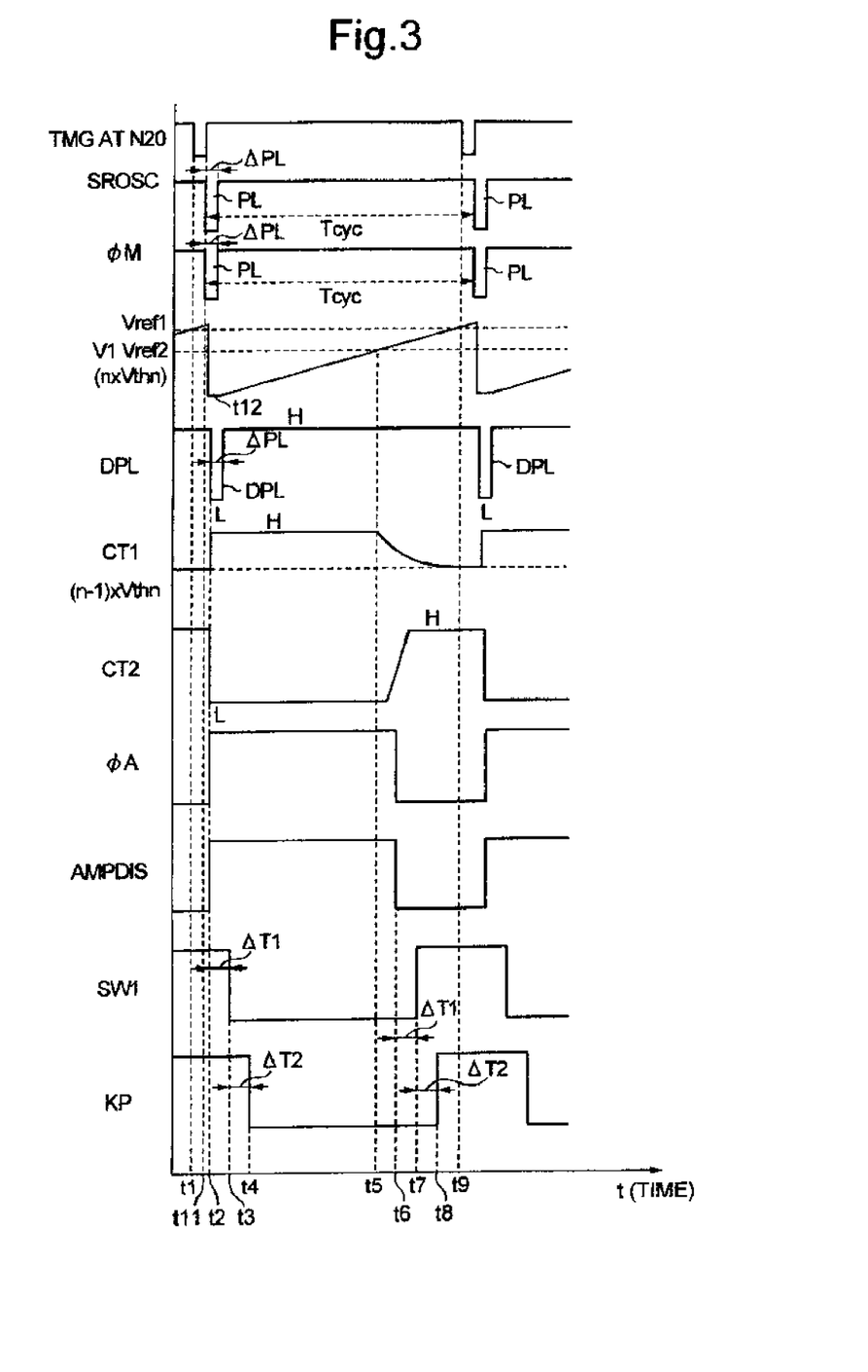
FIG. 3 is a waveform diagram showing operation of the oscillator shown in FIG. 1.

Referring to FIG. 3, comparison node N1 is charged by charge/discharge circuit 105 before time t1. Accordingly, voltage V1 of comparison node N1 gradually rises.

When voltage V1 exceeds the reference voltage Vref1 at time t1, differential amplifier 101 outputs timing signal TMG at a logic zero. At time t1, switch circuit 2 is on and the operation of voltage clamp 8 is interrupted, and therefore, timing signal TMG is input to pulse generator 110. Pulse generator 110 outputs intermediate signal φM to node N30 in response to timing signal TMG at time t11 after a delay of a predetermined time. When intermediate signal φM is output, transistor PM100 is turned on. As a result, timing signal TMG at node N20 transitions high at time t11 and pulse PL is formed in the intermediate signal φM output from pulse generator 110.

At time t12 slightly delayed from pulse PL, charge/discharge circuit 105 discharges comparison node N1. The time is delayed from time t11 because of an influence of delays caused by inverters IV101 and IV102. Since comparison node N1 is discharged, voltage V1 transitions low. Thus, transistor NM$0_0$ in discharge circuit 43 of control circuit 4 is turned off. As a result, the discharge of control node N2 stops.

At time t2 after voltage V1 drops to turn off transistors NM$0_0$ to NM$0_{n-1}$ in discharge circuit 43, delayed pulse DPL is output from pulse delay circuit 42. Transistor PM0 in charge circuit 41 is turned on in response to delayed pulse DPL. Transistor PM0 is on during a pulse width ΔPL of delayed pulse DPL. While transistor PM0 is on, control node N2 is charged. As a result, control signal CT1 output by control node N2 is disabled (logic one). Since transistors NM$0_0$ to NM$0_{n-1}$ in discharge circuit 43 are off, no short-circuit current results.

When pulse delay circuit 42 outputs delayed pulse DPL, transistor NM1 in waveform shaping circuit 5 receives inverted delayed pulse /DPL through inverter IV4. Transistor NM1 is on when it receives inverted delayed pulse /DPL (i.e. during the pulse width ΔPL), so that shaping node N3 is discharged. As a result, control signal CT2 output by shaping node N3 becomes disabled (logic zero). Since control signal CT1 is high, transistor PM1 is off. Therefore, the short-circuit current does not flow in waveform shaping circuit 5.

Control signal CT2 propagates through inverters IV9 and IV10 and is routed to inverter IV11. Inverter IV11 outputs the deactivated (logic one) signal AMPDIS in response to control signal CT2. As a result, differential amplifier 101 halts operation in response to receipt of the deactivated signal AMPDIS at logic one at time t2.

At time t3 after a lapse of predetermined time ΔT1 from time t2, delay circuit 6 outputs switch signal SW1 and switch signal SW2, such that the switch circuit 2 is turned off. Further, at time t4 after a lapse of predetermined time ΔT2 from time t3, delay circuit 7 outputs clamping signal KP at a logic zero level. As a result, voltage clamp 8 fixes timing signal TMG at node N20 to the disabled state (logic one). When differential amplifier 101 halts operation, timing signal TMG is in a high impedance state. Therefore, unless switch circuit 2 is provided, noise may be introduced to output signal SROSC of oscillator 1. In this embodiment, differential amplifier 101 and pulse generator 110 are separated from each other by switch circuit 2, and further, timing signal TMG at node N20 is clamped high by voltage clamp 8, and therefore, noise is not transmitted to pulse generator 110. Consequently, an operational interrupt of differential amplifier 101, does not result in a malfunction of oscillator 1.

Since switch circuit 9 in latch circuit 3 is turned on at time t3, latch circuit 3 captures output signal SROSC of pulse generator 110. Therefore, even if noise is generated in pulse generator 110 while differential amplifier 101 halts operation, the output of oscillator 1 is kept stable by latch circuit 3. Switch circuit 2 and voltage clamp 8 are both off during a period from time t3 to time t4, causing timing signal TMG to become unstable. Therefore, output signal SROSC of oscillator 1 should be stabilized by operating latch circuit 3 from time t3 to time t4.

After a lapse of pulse width APL from time t2, since intermediate signal φM output by pulse generator 110 becomes high, charge/discharge circuit 105 charges comparison node N1. Specifically, P-channel MOS transistor (not illustrated) of inverter IV101 in charge/discharge circuit 105 is turned on so that charge/discharge circuit 105 continues to supply the charge to capacitor C100, causing voltage V1 of comparison node N1 to rise gradually.

Because of its gradual rise, Voltage V1 exceeds reference voltage Vref2 at time t5. In this event, a value obtained by subtracting ground voltage GND from the gate voltage of transistor $NM0_0$ (voltage V1) exceeds the total threshold voltage (n×Vthn), and therefore, transistors $NM0_0$ to $NM_{n-1}$ are fully turned on. Consequently, control node N2 is discharged. However, inasmuch as comparison node N1 is charged slowly and discharge circuit 43 includes diode-connected transistors $NM0_1$ to $NM_{n-1}$, control node N2 is gradually discharged. As a result, the transition from a logic one to a logic zero ((n−1)×Vthn) of control signal CT1 is not abrupt. While control signal CT1 shifts from a logic one to a logic zero, transistor PM0 remains off. Therefore, no charge is newly supplied to control node N2 so that only the charge stored up to the level of supply voltage VCC during pulse width APL from time t2 is discharged. Thus, the generation of the short-circuit current can be prevented.

When a value obtained by subtracting a gate voltage (control signal CT1) from a source voltage (internal supply voltage VCC) of transistor PM1 in waveform shaping circuit 5 exceeds a threshold voltage $|Vth_{PM1}|$ of transistor PM1 in consequence of the gradual drop in level of the control signal CT1 after time t5, transistor PM1 is fully turned on. In this event, transistor PM1 charges the shaping node N3 so that control signal CT2 gradually rises. Since transistor NM1 in waveform shaping circuit 5 is fully off in this event, the short-circuit current is not generated although control signal CT1 does not drop down to (n−1)×Vthn. To this end, the charge speed of shaping node N3 is faster than the discharge speed of control node N2. As a result, the rising slope of the waveform of control signal CT2 becomes steeper than the falling slope of the waveform of control signal CT1.

Since the slope of the waveform of control signal CT2 output by waveform shaping circuit 5 can be increased, generation of the short-circuit current in subsequent inverters IV9 to IV20 can be suppressed and the slope of the waveforms of their output signals also increases. For example, as shown in FIG. 3, the slope of the waveform of output signal φA of inverter IV9 becomes steeper.

Inverter IV11 outputs signal AMPDIS at time t6 in response to control signal CT2. Differential amplifier 101 then starts operation in response to a logic zero received from logic gate 10.

As understood from the foregoing description, differential amplifier 101 halts operation during the period from time t2 to time t6. Therefore, the average power consumption of oscillator 1 can be reduced.

Although differential amplifier 101 initializes operation at time t6, switch circuit 2 remains off until time t7 after a lapse of predetermined time ΔT1 from time t6. This prevents malfunction of pulse generator 110 due to noise because immediately after the startup of differential amplifier 101, operation thereof is unstable so that noise may enter timing signal TMG. Similarly, for preventing malfunction of oscillator 1, switch circuit 9 remains on up to time t7 so that latch circuit 3 continues to capture a value of intermediate signal φM at time t3 that is output by pulse generator 110.

At time t7, switch signal SW1 output by delay circuit 6 becomes high and switch signal SW2 becomes low. As a result, switch circuit 2 is turned on and latch circuit 3 launches output signal SROSC at a value of intermediate signal φM after time t7. However, timing signal TMG at node N20 remains clamped high by voltage clamp circuit 8 at time t7. If switch circuit 2 is turned on and further voltage clamp circuit 8 stops operating both at time t7, there is a possibility that timing signal TMG at node N20 will become unstable due to an influence of coupling capacitance in switch circuit 2. Therefore, the voltage clamp circuit 8 halts operation at time t8 after a lapse of predetermined time ΔT2 from time t7.

After the lapse of predetermined time ΔT2 from time t7, i.e. at time t8, clamping signal KP from delay circuit 7 transitions high. Therefore, transistor PM2 in voltage clamp circuit 8 is turned off. By time period t8, differential amplifier 101 has recovered from its initial power-on unstable state and outputs a stable timing signal TMG to node N10. Then, at time t9 when voltage V1 again exceeds reference voltage Vref1, differential amplifier 101 asserts timing signal TMG low. Operation after time t9 is the same as operation after time t1 so that oscillator 1 outputs a pulse PL per period Tcyc.

While the invention has been described in detail, the foregoing description is in all aspects illustrative and not restrictive. It is understood that numerous other modifications and variations can be devised without departing from the scope of the invention.

What is claimed is:

1. An oscillator circuit comprising:

A comparator circuit adapted to assert a timing signal when a voltage at a first node exceeds a first reference voltage;

a pulse generator provided to output a pulse responsive to receipt of the asserted timing signal;

a charge/discharge circuit provided to discharge the first node when the pulse is received and charging the first node when the pulse is not received; and a control circuit capable of asserting an interrupt to the comparator circuit when the voltage of the first node does not exceed a second reference voltage lower than the first reference voltage, wherein the control circuit comprises:

a second node for outputting a first control signal used for operating the comparator circuit;

a first charging circuit coupled to the second node for charging the second node when the voltage of the first node is lower than the second reference voltage and when the pulse is received from the pulse generator; and a first discharge circuit coupled to the second node for discharging the second node when the voltage of the first node exceeds the second reference voltage.

2. An oscillator circuit according to claim 1, wherein the first charging circuit comprises:

a pulse delay circuit to output a delayed pulse; and a first transistor that is turned on in response to the delayed pulse.

3. An oscillator according to claim 2, wherein the first discharge circuit comprises:

a second transistor having a drain connected to the second node and a gate connected to the first node; and a third transistor coupled to a diode and coupled in series to the second transistor.

4. An oscillator according to claim 3, further comprising a waveform shaping circuit to output a second control signal obtained by increasing a slope of the first control signal when the first control signal is asserted, wherein the waveform shaping circuit comprises:

a third node to output the second control signal;

a second charge circuit connected to the third node for charging the third node when the first control signal is asserted; and a second discharge circuit connected to the third node for discharging the third node when the second charging circuit does not charge the third node and the pulse is received from the pulse generator.

5. An oscillator according to claim 4, further comprising:

a switch coupled between the comparator circuit and the pulse generator, the switch being disabled when the first control signal is not asserted and enabled when the first control signal is asserted; and a voltage clamp to hold the timing signal to a logic zero level when the first control signal is not asserted and to a logic one level when the first control signal is asserted.

6. An oscillator circuit according to claim 5, wherein the switch is turned on after a first delay from the assertion of the first control signal, and the voltage clamp is disabled after a lapse of a second delay following the first delay.

7. An oscillator circuit according to claim 5, further comprising a latch coupled to an output node of the pulse generator to capture an output signal of the pulse generator when the first control signal is not asserted.

8. An oscillator circuit according to claim 1, wherein the first node comprises a comparison node.

9. An oscillator circuit according to claim 1, wherein the second node comprises a control node.

10. An oscillator circuit according to claim 4, wherein the third node comprises a shaping node.

11. A method of controlling an oscillator adapted for self-refresh timing of a memory array, the method comprising:

comparing a voltage at a first node to a first reference voltage with a comparator;

asserting a timing signal when the voltage at the first node is greater than the first reference voltage;

generating a pulse corresponding to the timing signal with a pulse generator;

discharging the first node when the pulse is generated;

charging the first node when the pulse is not generated; and asserting an interrupt to the comparator with a control circuit when the voltage at the first node is less than a second reference voltage that is lower than the first reference voltage;

outputting a first control signal from a second node to trigger the comparator;

charging the second node with a first charging circuit when the voltage of the first node is lower than the second reference voltage and when the pulse is received from the pulse generator; and discharging the second node with a first discharge circuit when the voltage of the first node exceeds the second reference voltage.

12. The method according to claim 11, wherein the first node further comprises a comparison node.

13. The method according to claim 11, wherein the second node comprises a control node.

14. The method according to claim 11, further comprising:

outputting a delayed pulse with a pulse delay circuit; and turning on a first transistor of the first charging circuit in response to the delayed pulse.

15. The method according to claim 12, further comprising:

coupling a drain of a second transistor to the second node;

coupling a gate of the second transistor to the first node; and coupling a third transistor to a diode and the second transistor.

16. The method according to claim 15, further comprising:

increasing a slope of the first control signal when the first control signal is asserted with a waveform shaping circuit;

outputting a second control signal with the waveform shaping circuit, the second waveform control signal having a steeper slope than the first control signal;

charging a third node when the first control signal is asserted; and providing a second discharge circuit connected to the third node for discharging the third node when the second charging circuit does not charge the third node and the pulse is received from the pulse generator.

17. The method according to claim 16, further comprising:

providing a switch coupled between the comparator circuit and the pulse generator, the switch being disabled when the first control signal is not asserted and enabled when the first control signal is asserted; and providing a voltage clamp to hold the timing signal to a logic zero level when the first control signal is not asserted and to a logic one level when the first control signal is asserted;

turning on the switch after a first delay from the assertion of the first control signal; and disabling the voltage clamp after a lapse of a second delay following the first delay.

18. The method according to claim 17, further comprising:

capturing an output signal of the pulse generator when the first control signal is not asserted with a latch.

* * * * *